United States Patent [19]

Hoshino et al.

[11] Patent Number: 5,445,526
[45] Date of Patent: Aug. 29, 1995

[54] MUTLIPLE-PIN TERMINAL ADAPTOR

[75] Inventors: Masayoshi Hoshino; Masakazu Yayoshi, both of Tokyo, Japan

[73] Assignees: JC Electronics Corporation; Toshiba Chemical Corporation, Japan

[21] Appl. No.: 197,670

[22] Filed: Feb. 17, 1994

Related U.S. Application Data

[63] Continuation of Ser. No. 976,944, Nov. 16, 1992, abandoned.

[30] Foreign Application Priority Data

Dec. 25, 1991 [JP]  Japan .................................. 3-357312

[51] Int. Cl.$^6$ ......................... H01R 9/09; H01R 13/20
[52] U.S. Cl. ......................................... 439/69; 439/75
[58] Field of Search ..................... 439/68, 69, 70, 74, 439/75, 482; 29/705

[56] References Cited

U.S. PATENT DOCUMENTS

| | | | |
|---|---|---|---|
| 2,890,390 | 6/1959 | Goodwin, Jr. ................. | 439/69 X |
| 3,340,439 | 9/1967 | Henschen et al. ................ | 439/69 X |
| 3,459,998 | 8/1969 | Focarile ...................... | 439/69 X |
| 4,421,368 | 12/1983 | Saban ........................ | 439/70 X |
| 4,799,897 | 1/1989 | Mogi et al. .................. | 439/70 X |
| 5,030,110 | 7/1991 | Groves et al. ................ | 439/69 |
| 5,033,977 | 7/1991 | Ignasiak ..................... | 439/482 |
| 5,088,930 | 2/1992 | Murphy ....................... | 439/70 |
| 5,109,596 | 5/1992 | Driller et al. ................ | 29/705 |

OTHER PUBLICATIONS

"Stacked High–Density Multichip Module" Jarvela et al., IBM Tech. Disc. Bulletin vol. 14, No. 10, pp. 2896–2897, Mar. 1972.

*Primary Examiner*—Peter Dungba Vo
*Attorney, Agent, or Firm*—Bruce L. Adams; Van C. Wilks

[57] ABSTRACT

A multiple-pin terminal adapter comprising a substrate and a multiplicity of electrical contact pins extending from above and below the substrate for connection with printed circuit boards. A first group of contact pins extend downwardly for connection with the underlying printed circuit board, while a second group of contact pins extend upwardly out of axial alignment with the first group to assume a generally meander or otherwise random formation whereby adjacent contact pins in the second group are spaced a sufficient distance apart from one another to facilitate access for solder connection. A relay socket means is also provided for use in combination with the terminal adapter to provide easy access for connection to printed circuit boards packed with high density electrical components.

4 Claims, 5 Drawing Sheets

MUTLIPLE-PIN TERMINAL ADAPTOR

This is a continuation of application Ser. No. 07/976,944 filed Nov. 16, 1992, now abandoned.

BACKGROUND OF THE INVENTION

1. Field of the Invention

This invention relates to a terminal adapter having a multiple-contact component for electrical connection to printed circuit boards and associated electronic parts. The invention is also directed to a relay socket means operatively associated with the terminal adapter.

2. Prior Art

Generally, printed circuit boards are provided with a large number of leads connecting to densely packed electronic circuit elements such as resistors and capacitors as in integrated circuits. The leads are, however, broadly standardized under common specifications related to configuration, lead-to-lead spacing (pitch) and other design parameters so as to provide facilitated circuit assembly and enhanced productivity.

For purposes of illustration, a typical form of conventional flat package integrated circuit is shown in FIG. 12, incorporating a total of 64 contact pins known as "Gull Wing" extending in a closely aligned row downwardly symmetrically from the four sides of a rectangular substrate for solder connection to corresponding leads on an underlying printed circuit board (not shown).

The design and development work on printed circuit boards would be held in abeyance pending the outcome of newly developed circuit components of a high packing density. This procedure is time-consuming. It is therefore desirable to carry out the development project of circuit component parts simultaneously or parallel with the design of related circuit boards, in which instance numerous signal leads are connected to extremely crowded terminal lands disposed on the printed circuit board which represent the prospective positions for mounting high density circuit components, the signal leads being then connected to an external equivalent electronic circuitry for simulation test. The work involved in making such multiple lead connections is caution-demanding, tedious and time-consuming, particularly with an increase in the complexity of sophisticated circuit patterns. This problem becomes aggravated with printed circuit boards having electrical components in close proximity to the points of lead connection.

SUMMARY OF THE INVENTION

With the foregoing problems of the prior art in view, the present invention seeks to provide improvements in and relating to a multiple-pin terminal adapter whereby electrical signals can be derived from a multiplicity of leads on a highly packed printed circuit board with utmost ease and accuracy.

The invention also seeks to provide a relay socket means operatively associated with the terminal adapter for facilitating the making of lead connections for a printed circuit board mounted with semiconductors and like electrical components.

The invention further seeks to provide a combination of a terminal adapter and one or more relay socket means.

The above and other objects and features of the invention will be better understood from the following detailed description taken in conjunction with the accompanying drawings. Like reference numerals refer to like or corresponding parts throughout the several views.

According to the invention, there is provided a multiple-pin terminal adapter for connection to printed circuit boards which comprises a substrate made of an insulating material, a first group of contact pins extending downwardly from the substrate and vertically linearly aligned in closely spaced relation, and a second group of contact pins extending upwardly from the substrate and displaced axially relative to the first group of contact pins with the spacing (pitch) between adjacent contact pins in the second group becoming greater than corresponding spacing in the first group.

BRIEF DESCRIPTION OF THE DRAWINGS

FIG. 12b is a side elevational view of the package shown in FIG. 12a.

DETAILED DESCRIPTION OF THE PREFERRED EMBODIMENTS

Figure 1:
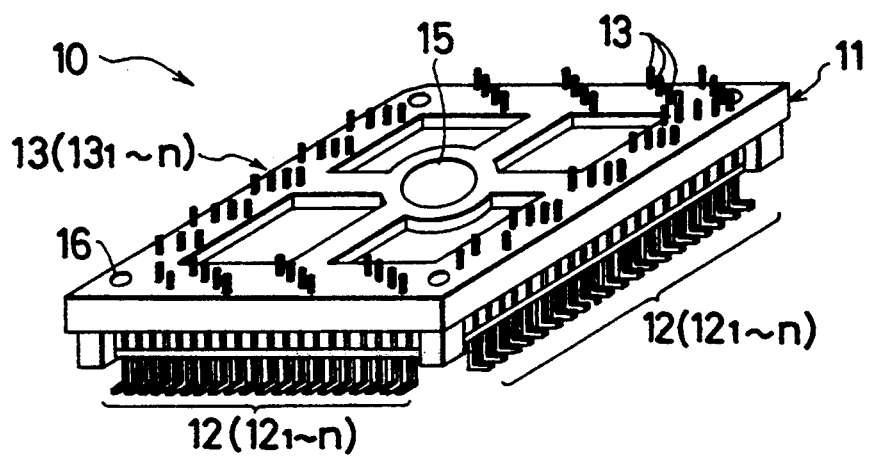
FIG. 1 is a perspective view of a terminal adapter for printed circuit boards embodying the invention.

Referring now to the drawings and in particular to FIGS. 1 through 2a, 2b and 2c inclusive, there is shown a terminal adapter 10 embodying the invention for use with printed circuit boards. The terminal adapter 10 comprises a generally rectangular substrate 11 made of a suitable insulating material such as, for example, a heat-resistant polymer, first groups 12 of a multiplicity of electrical contact pins $12_{1-n}$ extending vertically downwardly from the bottom surface 11a of the substrate 11 for connection to corresponding leads 120 on an integrated circuit (IC) such as shown in FIG. 12, and second groups 13 of an equal number of contact pins $13_{1-n}$ extending from the top surface 11b of the substrate 11 in corresponding relation to the first groups 12 of pins $12_{1-n}$ and adapted to connect to another printed circuit board, an external circuit block (not shown) or a relay socket means later described.

Figure 12A:
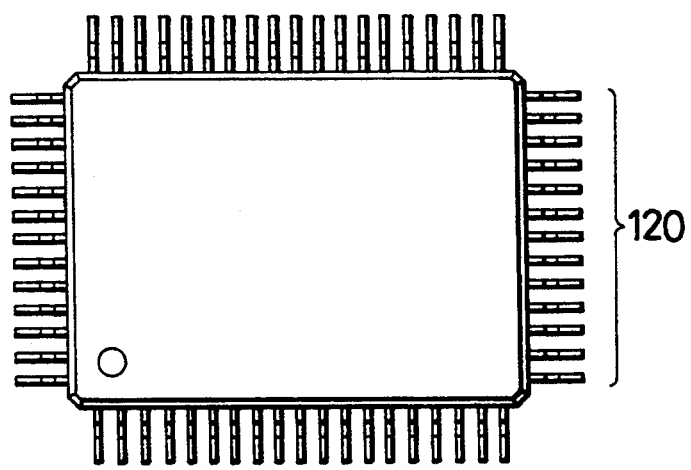
FIG. 12a is a top plan view of a conventional IC package.
Figure 12B:
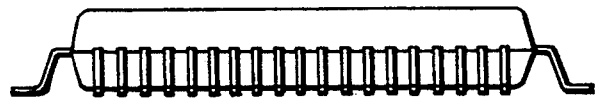

The first groups 12 of contact pins $12_{1-n}$ extend symmetrically from the four sides of the rectangular substrate 11 adjacent to their respective edges and have substantially the same shape and geometric formation as Gull Wing leads 120 of the typical IC shown in FIG. 12. There may be prepared for storage as many inventive terminal adapters of different shapes and geometric formations as there are standardized printed circuit boards so as to conveniently embrace a majority of standard ranges of high density components.

While the choice is open for the cross-sectional configuration of either of the first and second groups of contact pins 12 and 13, it is presently shown to be square for purposes of illustration. Both pin groups 12 and 13 may be integral or joined together by connecting conductive strips (not shown).

Figures 2A, 2B:
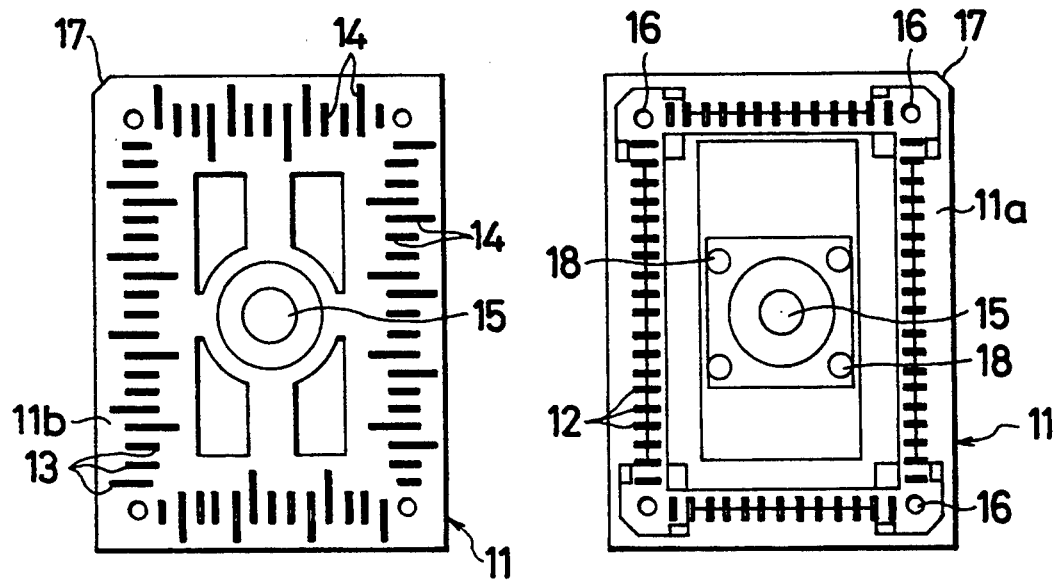
FIGS. 2a, 2b and 2c are a top plan view, a bottom plan view and an end elevational view, respectively of the terminal adapter.
Figure 2C:
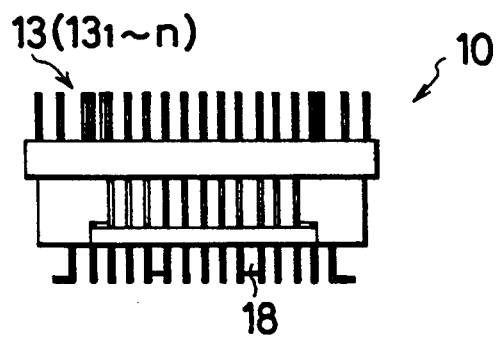

According to an important aspect of the invention, the individual contact pins $13_{1-n}$ in the second groups 13 projecting from the top surface 11b of the substrate 11 are oriented out of axial alignment with the corresponding contact pins $12_{1-n}$ in the first groups 12 which extend in a vertically linear array as shown in FIGS. 1 through 2C, with the results that adjacent contact pins in the second groups 13 are spaced a sufficient distance apart from one another to allow easy access for the making of electrical connection as by soldering to external circuit leads or lands. In the present embodiment, the second group pins $13_{1-n}$ are displaced relative to the first group pins $12_{1-n}$ by locating a selected member, i.e. a maximum of four of contact pins $12_{1-n}$ as shown in FIGS. 1 and 2a for purposes of illustration, progressively away from the corresponding number of contact pins $12_{1-n}$ in the first groups 12 so to present a generally meander formation consisting of a plurality of rows of contact pins $13_{1-n}$ aligned obliquely with respect to the linear arrays of the corresponding first group contact pins $12_{1-n}$. This geometric formation may be achieved by the provision of guide slits 14 in the substrate 11 for adjustably receiving and securing the second group pins $13_{1-n}$ in place as better shown in FIG. 2a. The geometric arrangement or formation of the second group contact pins $13_{1-n}$ on the top surface 11b of the substrate 11 may be random or not otherwise restricted to the specific embodiment illustrated in FIGS. 1 and 2b, the important results being that there are sufficient spaces or open areas between adjacent contact pins $13_{1-n}$ to ensure ease of access to and accurate electrical connection of the contact pins $13_{1-n}$ to lead wires, printed circuit boards or relay socket means hereafter described.

Figure 3A:
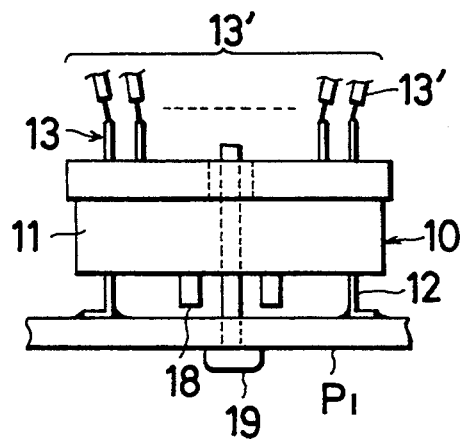
FIGS. 3a and 3b are diagrammatic end elevational views utilized to explain the manner in which the terminal adapter is put to use.

The substrate 11 is provided for purposes hereafter to be described with a through-opening 15 at its center, a guide hole 16 at each of its four corners, one of which corners is chamfered as at 17, and four support lugs 18 equally spaced around the through-opening 15 and slightly shorter than the first group contact pins $12_{1-n}$ as better shown in FIG. 3a.

In use of the terminal adapter 10 thus constructed, it is surface-mounted on a first printed circuit board $P_1$ by bringing the first group contact pins $12_{1-n}$ into registration with corresponding leads on the board $P_1$ and joining them together by soldering manually or automatically in a manner well known in the art, in which instance a threaded bolt 19 may be used to clamp the adapter 10 and the board $P_1$ together in place to facilitate the connecting work.

Figure 3B:
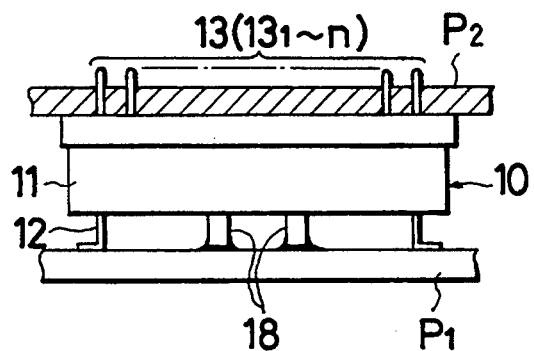

Alternatively, the terminal adapter 10 and the circuit board $P_1$ can be held together against displacement during the mounting operation by anchoring the support lugs 18 against the top surface of the board $P_1$ with use of a suitable adhesive compound as shown in FIG. 3b.

Designated at 13' are lead wires of suitable length for interconnecting the second group contact pins $13_{1-n}$ with other circuit blocks equivalent to integrated circuits (not shown).

FIG. 3b shows another mode of application in which a second printed circuit board $P_2$ is mounted on the top surface 11b of the terminal adapter 10 to make electrical connection with the first printed circuit board $P_1$.

Figure 4A:
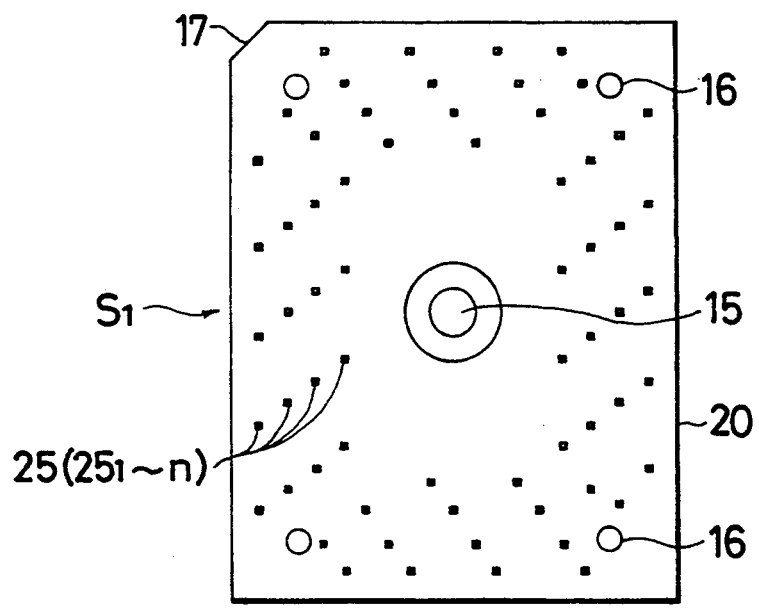
FIG. 4a is a top plan view of a relay socket means embodying the invention.
Figure 4B:
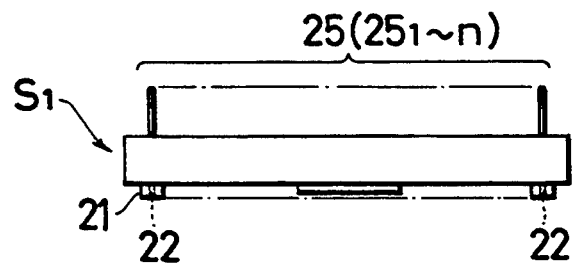
FIG. 4b is an end elevational view of the same.

The printed circuit board $P_1$ is often variable in effective height due to the presence of certain electronic circuit components of different heights in the vicinity of surface-mounting. It is, however, economically unfeasible to prepare in advance as many inventive terminal adapters as are required to meet with all such printed circuit boards. To cope with this problem, the invention provides a relay socket means generally designated at $S_1$ in FIGS. 4a and 4b which is used in combination with the terminal adapter 10 in effectively mounting printed circuit boards having different heights.

Figure 5A:
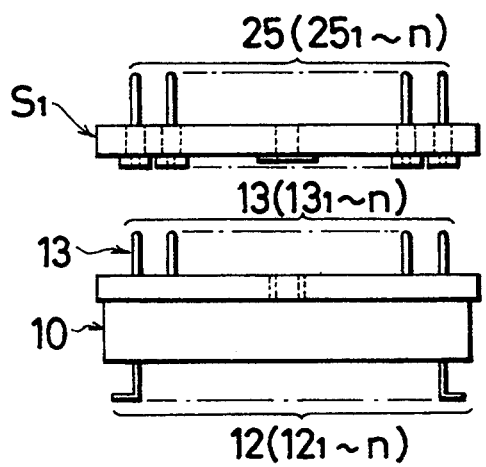
FIG. 5a and 5b are diagrammatic end elevational views utilized to explain one form of application of the relay socket means.
Figure 5B:
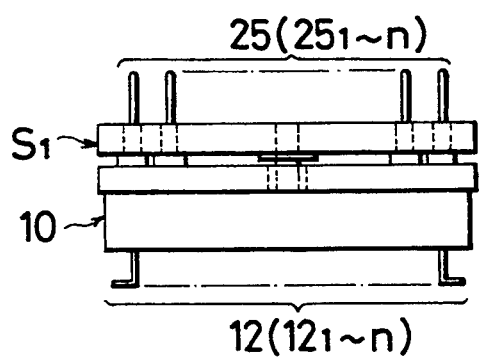

The relay socket means $S_1$ comprises a substrate member 20 made of a suitable insulating material such as a glass/epoxy laminate and a multiplicity of upwardly extending contact pins 25 ($25_{1-n}$) equal in number to the contact pins $12_{1-n}$ ($13_{1-n}$) on the terminal adapter 10. The substrate 20 of the relay socket means $S_1$ is coextensive with the substrate 11 of the terminal adapter 10 and is substantially a replica of the latter so far as concerns the geometric formation of the mating contact pins 25 and 13. The substrate member 20 is provided at its bottom surface with jacks 21 equal in number to and positioned in registration with the contact pins $25_{1-n}$, the jacks 21 each having a pin-receiving hole 22 for receiving each of the corresponding second group contact pins $13_{1-n}$ on the terminal adapter 10 when the relay socket means $S_1$ is mounted on the latter as depicted in FIGS. 5a and 5b. The substrate member 20 is further provided with guide holes 16 formed at its four corners at positions to register with the corresponding guide holes 16 in the substrate 11 of the terminal adapter 10.

Figure 6A:
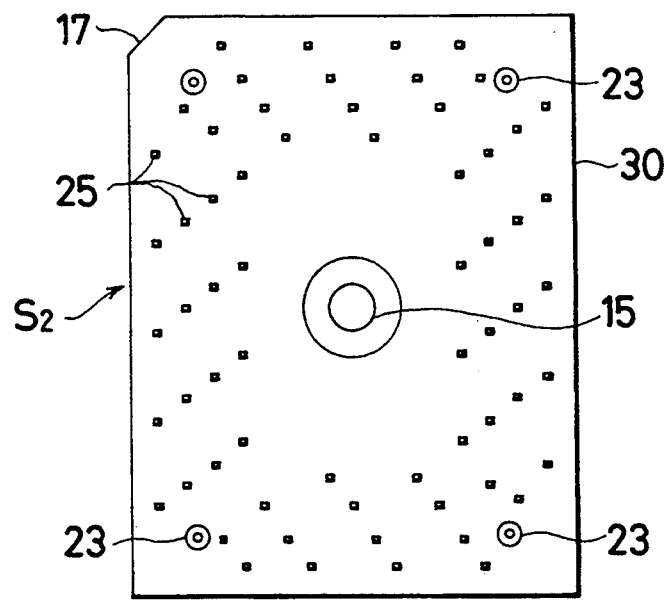
FIG. 6a is a top plan view of a modified relay socket means.
Figure 6B:
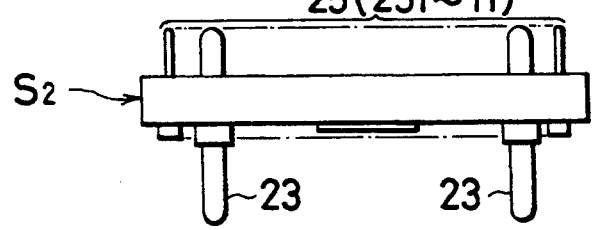
FIG. 6b is an end elevational view of the same.
Figure 7A:
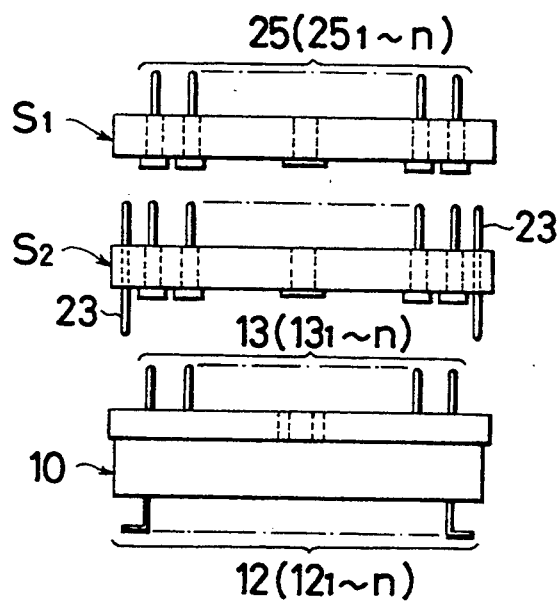
FIG. 7a and 7b are diagrammatic end elevational views utilized to explain another form of application of the relay socket means.
Figure 7B:
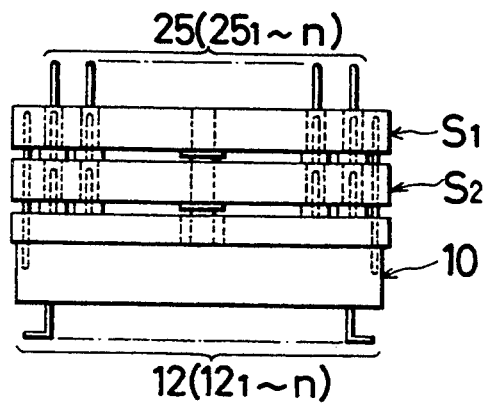
Figure 8:
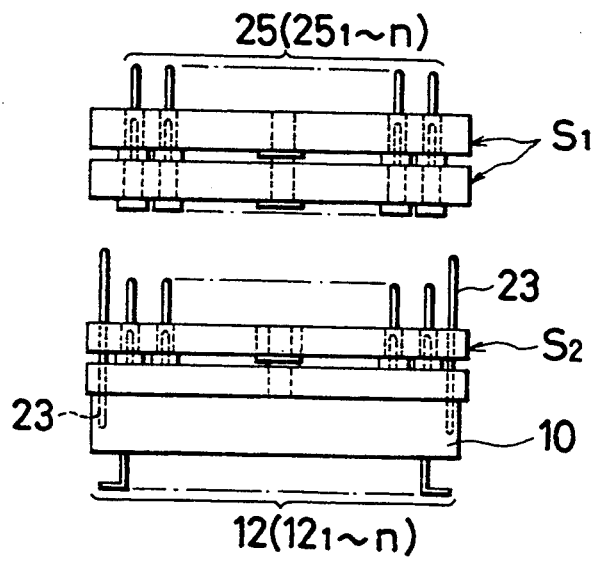
FIG. 8 is a diagrammatic end elevational view utilized to explain a further form of application of the relay socket means.

FIGS. 6a and 6b show a modified form of relay socket means $S_2$ which is substantially identical in construction with the relay socket means $S_1$ except that there are provided four retaining posts 23 at the respective corners of a substrate member 30 for engagement in the corresponding guide holes 16 of the terminal adapter 10 and those of the first relay socket means $S_1$. The retaining posts 23 are made larger in length than the contact pins 13, as seen in FIG. 8, so that prior to the contact pins 13 being mated with the contact pins 25, the retaining posts 23 are brought into fitting engagement with the guide holes 16 of the terminal adapter 10 and those of the first relay socket means $S_1$. This facilitates position and mating of the contact pins 13, 25 with great simplicity and accuracy. More specifically, the retaining posts 23 of the second relay socket means $S_2$ extend both upwardly and downwardly from the substrate member 30 and are dimensioned to come into fitting engagement through and with the guide holes 16 of the underlying terminal adapter 10 and the corresponding guide holes 16 of the overlying first relay socket means S₁ as shown in FIGS. 7a and 7b. The length of projection of the retainer posts 23 above and below the substrate member 30 may be varied depending upon the total height of relay socket means superimposed one upon another. See for example FIG. 8 where there are three interconnected relay socket means S₁, S₁ and S₂ mounted on the terminal adapter 10.

Figure 9:
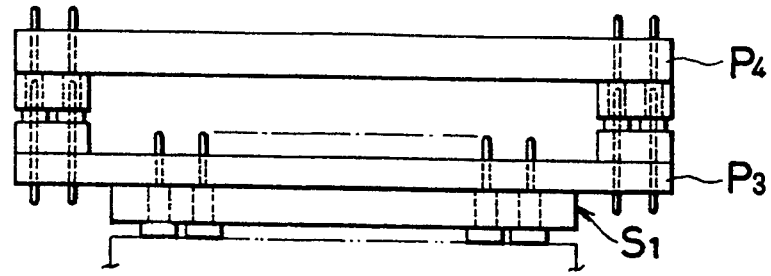
FIG. 9 is a diagrammatic elevational view utilized to explain still another form of application of the relay socket means.

FIG. 9 illustrates two printed circuit boards P₃ and P₄ as being connected to the uppermost relay socket means S₁.

Figure 10:
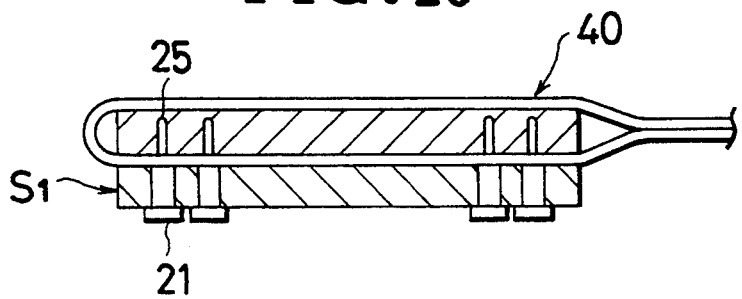
FIG. 10 is a diagrammatic end elevational view utilized to explain still further and another form of application of the relay socket means.
Figure 11:
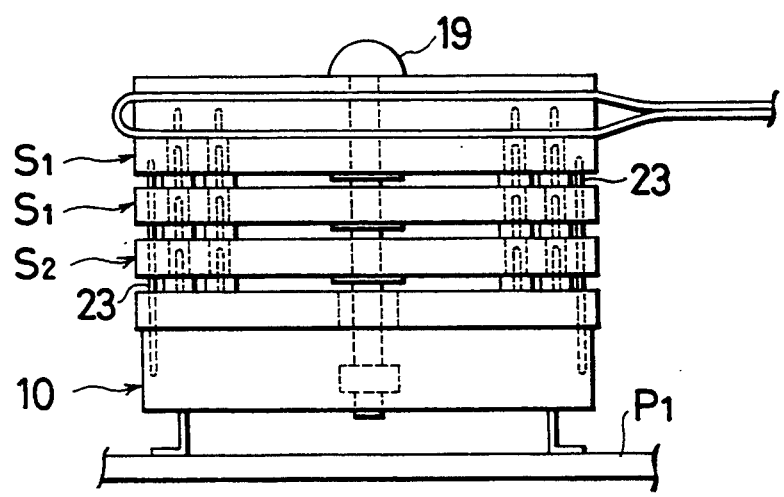
FIG. 11 is a diagrammatic end elevational view showing the terminal adapter combined in use with the socket relay means and a flexible printed circuit board.

Other forms of application of the relay socket means according to the invention include combining the relay socket means S₁ with a flexible printed circuit film 40 as shown in FIG. 10 and further combining this with the underlying intermediate relay socket means S₂ as shown in FIG. 11.

There are many other forms in which the terminal adapter 10 and the relay socket means S₁ (S₂) may be effectively used to make electrical connection to printed circuit boards and the like.

Therefore, various changes and modifications may be made in the specific form and construction herein advanced as appears obvious to one skilled in the art without departing from the spirit and scope of the appended claims.

What is claimed is:

1. A multiple-pin terminal adapter for electrical connection to printed circuit boards, the terminal adapter comprising: a generally rectangular substrate made of insulating material; a first group of a multiplicity of contact pins extending downwardly from said substrate; and a second group of a multiplicity of contact pins extending upwardly from said substrate, said first and second groups of contact pins being equal in number to each other and connected electrically with each other, said first group of contact pins being disposed linearly in closely spaced relation for electrical connection to corresponding leads on a flat-packaged integrated circuit, said first group of contact pins having substantially the same shape and geometry as the integrated circuit to be electrically connected thereto, and said second group of contact pins being disposed at a larger pin-to-pin spacing than and said first group of contact pins, and the contact pins of said second group being disposed out of axial alignment with the contact pins of said first group for electrical connection to leading wires or external components.

2. A terminal adapter according to claim 1; wherein said second group of contact pins is oriented in a meandering formation via guide slits provided in said substrate.

3. In combination:
   (a) a multiple-pin terminal adapter for electrical connection to printed circuit boards, the terminal adapter comprising a generally rectangular substrate made of insulating material, a first group of a multiplicity of contact pins extending downwardly from said substrate, and a second group of a multiplicity of contact pins extending upwardly from said substrate, said first and second groups of contact pins being equal in number to each other and connected electrically with each other, said first group of contact pins being disposed linearly in closely spaced relation for electrical connection to corresponding leads on a flat-packaged integrated circuit, said first group of contact pins having substantially the same shape and geometry as the integrated circuit to be electrically connected thereto, and said second group of contact pins being disposed at a larger pin-to-pin spacing than and said first group of contact pins, and the contact pins of said second group being disposed out of axial alignment with the contact pins of said first group for electrical connection to leading wires or external components; and
   (b) a relay socket means for use with the terminal adapter, the socket means comprising a substrate member made of insulating material and being similar in shape to and coextensive with the substrate of the terminal adapter, a multiplicity of contact pins projecting upwardly from said substrate member and oriented equal in number and geometry to the second group of contact pins on the terminal adapter, and a plurality of jacks extending downwardly from said substrate member and positioned equal in number and formation to and in registration with the multiplicity of contact pins on said substrate member.

4. The combination according to claim 3; wherein the socket means has a retaining post at each of its corners, the retaining posts extending upwardly, or both downwardly and upwardly, and dimensioned to make fitting engagement with guide holes provided at corners in the terminal adapter, each of said retaining posts having a larger length than the second group of contact pins on the terminal adapter.

* * * * *